United States Patent

Katamime et al.

Patent Number: 6,100,105

Date of Patent: *Aug. 8, 2000

[54] FABRICATION OF INGAALN BASED COMPOUND SEMICONDUCTOR DEVICE

[75] Inventors: Toshihisa Katamime, Saitama; Yasushi Iyechika, Ibaraki; Yoshinobu Ono, Ibaraki; Tomoyuki Takada, Ibaraki; Katsumi Inui, Ibaraki, all of Japan

[73] Assignee: Sumitomo Chemical Company, Ltd., Osaka, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/852,898

[22] Filed: May 9, 1997

[30] Foreign Application Priority Data

May 10, 1996 [JP] Japan ..................................... 8-116288

[51] Int. Cl.$^7$ .................................................. H01L 21/00
[52] U.S. Cl. ............................... 438/46; 438/47; 438/503
[58] Field of Search ..................................... 118/724, 725; 438/22, 46, 47, 478, 503; 257/76, 183; 372/45, 46

[56] References Cited

U.S. PATENT DOCUMENTS

| | | |
|---|---|---|
| 4,311,545 | 1/1982 | Bugl et al. . |
| 4,747,368 | 5/1988 | Brien ........................................ 118/724 |
| 5,432,808 | 7/1995 | Hataano et al. . |

FOREIGN PATENT DOCUMENTS

| | | |
|---|---|---|
| 0383215A2 | 8/1990 | European Pat. Off. . |
| 0476676A2 | 3/1992 | European Pat. Off. . |
| 485301 | 5/1992 | European Pat. Off. . |
| 0 688 070 A1 | 12/1995 | European Pat. Off. . |
| 0687749A1 | 12/1995 | European Pat. Off. . |
| 0688070A1 | 12/1995 | European Pat. Off. . |
| 36085A | 2/1989 | Japan . |
| 2 175 011 | 11/1986 | United Kingdom . |
| 2175011A | 11/1986 | United Kingdom . |
| WO 9210308 | 6/1992 | WIPO . |
| WO 9516804 | 6/1995 | WIPO . |

Primary Examiner—Charles Bowers
Assistant Examiner—Keith Christianson
Attorney, Agent, or Firm—Birch, Stewart, Kolasch & Birch, LLP

[57] ABSTRACT

A device for the production of a semiconductor compound by means of a metal organic vapor phase epitaxy method, has a structure including a metallic member disposed at a part brought into contact with an upstream flow of a raw material gas and another part for growing a compound semiconductor, wherein the metallic member is cooled to not higher than 300° C. The present invention provides a device for the production of a semiconductor compound with high productivity using a metallic material, wherein processing precision is high and the risk of breakage is low.

5 Claims, 6 Drawing Sheets

FABRICATION OF INGAALN BASED COMPOUND SEMICONDUCTOR DEVICE

BACKGROUND OF THE INVENTION

1. Field of the Invention

The present invention relates to a device for production of a compound semiconductor.

2. Description of the Related Art

Examples of a method for producing a compound semiconductor include molecular beam epitaxy (hereinafter referred to as "MBE", sometimes) method, metal organic vapor phase epitaxy (hereinafter referred to as "MOVPE", sometimes) method, hydride vapor phase epitaxy (hereinafter referred to as "HVPE", sometimes) method and the like. Among them, the MOVPE method is important because there can be formed an uniform layer having a surface area larger than that of the MBE method or HVPE method.

The MOVPE method is a method of supplying precursors and carrier gas containing constituent elements of a crystal to be grown in the molecule on a heated substrate, and pyrolytically decomposing the precursors to grow the crystal on the substrate. The substrate is heated by heat transfer from a heated jig for holding the substrate, which is generally referred to as a "susceptor".

Hereinafter, the precursors together with carrier gas are referred to as raw material gas, sometimes.

The susceptor is heated by a method such as induction heating, radiative heating by resistant heater and the like. In the crystal growth by means of the MOVPE method, the growing temperature often becomes 500° C. or higher and, therefore, a part whose temperature becomes high temperature such as several hundreds degrees due to radiation heating, heat transfer, etc. from the susceptor appears in the reaction vessel.

By the way, in the vapor phase epitaxy method of the compound semiconductor, the member of the device for production is exposed to a raw material gas atmosphere, such as hydrogen, metal organic compound, etc., at high temperature. Therefore, it is necessary that the member of the device for production is composed of a material which has high resistance to these raw material gases and causes little release of impurities.

Quartz is often used as a material of a member for device for semiconductor crystal growth by means of the MOVPE method because it is stable at high temperature and causes little release of impurities. However, quartz has drawbacks that the processing precision is poor and that the breakage is liable to be caused by an impact and a rapid change in temperature. Therefore, when higher processing precision and higher mechanical strength are required, a metallic material is preferably used.

On the other hand, since the metallic material having sufficient processability and sufficient mechanical strength imparts such properties, elements having an action which serves as impurities to a semiconductor material are added in almost all of cases. Therefore, when the alloy is exposed to high temperature, the alloy releases impurities contained therein and the impurities are incorporated into a crystal in the crystal growth process, thereby making it difficult to control the concentration of the impurities in the crystal or the crystal quality.

SUMMARY OF THE INVENTION

An object of the present invention is to provide a device for the production of a semiconductor compound with high productivity, which is suitable for the production of the semiconductor compound, using a metallic material wherein processing precision is high and the risk of breakage is low.

The present inventors have intensively studied the above issues. As a result, it has been found that, when using a metallic member after cooling to a specific temperature or less in a device for the production of a semiconductor compound using the metallic member, a device for production of a semiconductor with high productivity, which is suitable for production of the semiconductor compound, can be obtained. Thus, the present invention has been accomplished.

That is, the present invention relates to a device for production of a semiconductor compound by means of a metal organic vapor phase epitaxy method, which has a structure that uses a metallic member at a part brought into contact with an upstream flow of a raw material gas and another a part for growing a semiconductor compound, and the metallic member is cooled to not higher than 300° C.

Figure 1:
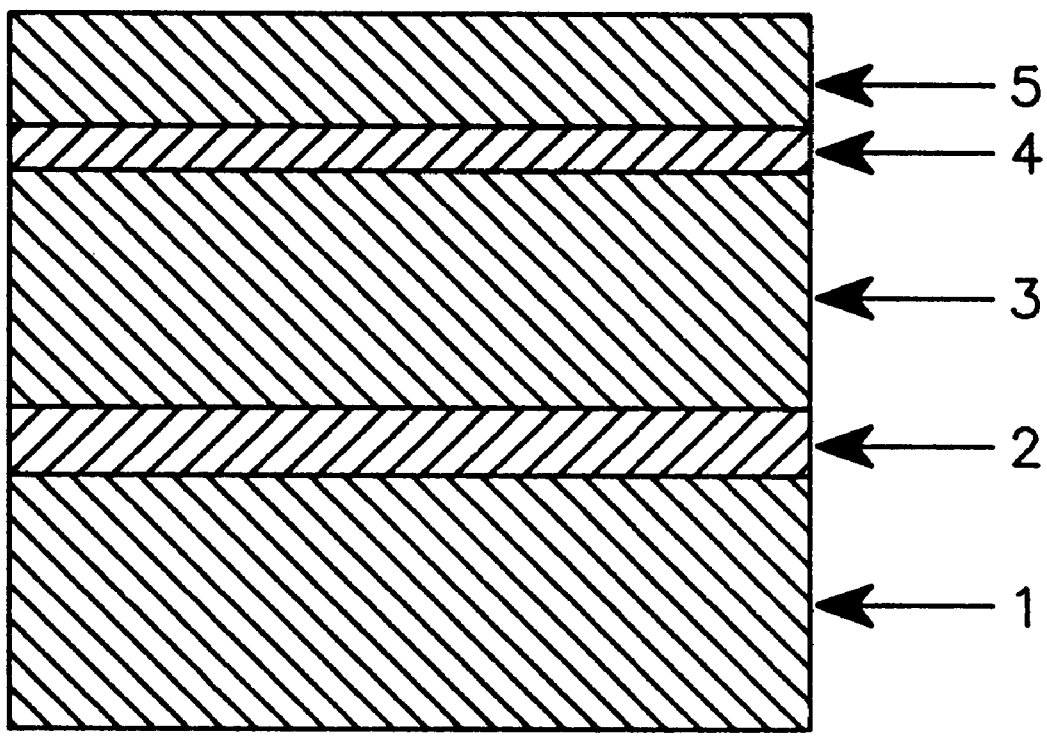
FIG. 1 is a diagram illustrating a structure of the Group III–V compound semiconductor of Reference Example 1.

The denotations used in the figures are as follows.
1: Sapphire substrate
2: GaN buffer layer
3: Non-doped GaN layer
4: InGaN layer
5: GaAlN layer
6: Part made of quartz in reaction vessel
7: Substrate
8: Susceptor
9: Metallic member

DETAILED DESCRIPTION OF THE INVENTION

The present invention will be explained in detail, hereinafter.

As the metallic member which can be used in the device for production of a compound semiconductor of the present invention, a heat-resistant alloy is preferred. Examples of the heat-resistant alloy include heat-resistant steel, stainless steel, nickel-based alloys or titanium alloys.

Specifically, alloys comprising Fe as a main component and other alloy elements having a concentration of not more than 50% are generally referred to as heat resistant steel. A steel comprising Fe as a main component and other alloy elements having a concentration of not more than 50%, wherein Cr is contained in an amount of about 12% or more, is generally referred to as "stainless steel". Examples of the nickel-based alloy include alloys prepared by adding Mo, Cr, Fe, etc. to Ni. Examples of the titanium alloy include alloys prepared by adding Al, Mo, etc. to Ti.

Examples of the heat-resistant steel used in the present invention include alloys containing Ni, Co., etc., in addition to several percent Cr. Examples of the stainless steel used in the present invention include alloys containing about 12% or more of Cr and 4% by weight or more of Ni. A preferable amount of Cr contained is not less than 16% by weight and not more than 24% by weight, more preferably not less than 16% by weight and not more than 20%. A preferable amount of Ni contained is not less than 9% by weight and not more than 15% by weight.

As the heat-resistant steel or stainless steel used in the present invention, alloys prepared by adding 0.1% by weight or more of Si so as to improve the corrosion resistance are preferred, and alloys prepared by adding 1% by weight or more of Si are more preferred. It may be used those wherein the corrosion resistance is further improved by adding a small amount of Ti, Nb, etc.

The above alloys are described in detail in "edited by Japanese Standard Society, JIS Hand Book, 86th edition, Vol. 1, Steel". The alloys are superior in processability and can be processed with high precision and, therefore, a member having a complicated shape can be obtained. Since these alloys are also superior in mechanical strength, a member having high degree of freedom for various uses can be obtained.

Specific examples of the above alloys include SUS201, SUS202, SUS301, SUS301J1, SUS302, SUS302B, SUS303, SUS303Se, SUS304, SUS304H, SUS304L, SUS304N1, SUS304N2, SUS304LN, SUS305, SUS305J1, SUS308, SUS308L, SUS309S, SUS309Mo, SUS310S, SUS316, SUS316H, SUS316L, SUS316N, SUS316LN, SUS316J1, SUS316J1L, SUS317, SUS317L, SUS317J1, SUS321, SUS321H, SUS347, SUS347H, SUS384, SUS385, SUSXM7, SUSXM15J1, SUH31, SUH35, SUH36, SUH37, SUH38, SUH309, SUH310, SUH330, SUH660, SUH661, SUS329J1, SUSJ2L, SUS405, SUS410L, SUS429, SUS430, SUS430L, SUS430LX, SUS434, SUS436L, SUS444, SUS447J1, SUS XM27, SUS XM-7, SUH21, SUH409, SUH446, SUH403, SUS410, SUS410S, SUS410J1, SUS416, SUS420J1, SUS420F, SUS429J1, SUS431, SUS440A, SUS440B, SUS440C, SUS440F, SUH1, SUH3, SUH4, SUH11, SUH600, SUH616, SUH630, SUH631, SUH631JI and the like.

Among these alloys, SUS304 and SUS316 are particularly superior in mechanical strength and chemical stability, and can preferably be used in the device for production of a semiconductor of the present invention.

Examples of the nickel-based alloy used in the present invention, i.e. alloy prepared by adding Mo, Cr and Fe to Ni, include alloys such as Hastelloy, etc. Specific examples of the composition include those containing 15% by weight or more Cr and 5% by weight or more of Mo in Ni. With respect to the preferred range of the alloy composition, a proportion of Cr is not: less than 16% by weight and not more than 30% by weight, a proportion of Mo is not less than 5% by weight and not more than 28% by weight, and Fe is not less than 2% by weight and not more than 20% by weight.

Examples of the titanium alloy used in the present invention, i.e. those prepared by adding Al and Mo to Ti, include those prepared by adding 2% by weight or more of Al and 0.5% by weight or more of Mo to Ti. With respect to the preferred range of the alloy composition, a proportion of Al is not less than 2% by weight and not more than 7% by weight and Mo is not less than 0.5% by weight and not more than 4% by weight.

Furthermore, Sn, Zr, etc. may be added to these alloys. An amount of Sn added is preferably not more than 11% by weight, and an amount of Zr added is preferably not more than 16% by weight.

In the device for production of a semiconductor compound of the present invention, the temperature of the part at an upstream side than a part for growing a compound semiconductor using the metallic member is set to not higher than 300° C., preferably not higher than 200° C. With respect to the temperature of the part using the metallic member, the surface temperature of the metallic member, which is brought into contact with a gas, may satisfy the above conditions, specifically. When the temperature is higher than 300° C., the purity of the grown crystal becomes insufficient, and it is not preferred.

Figure 4:
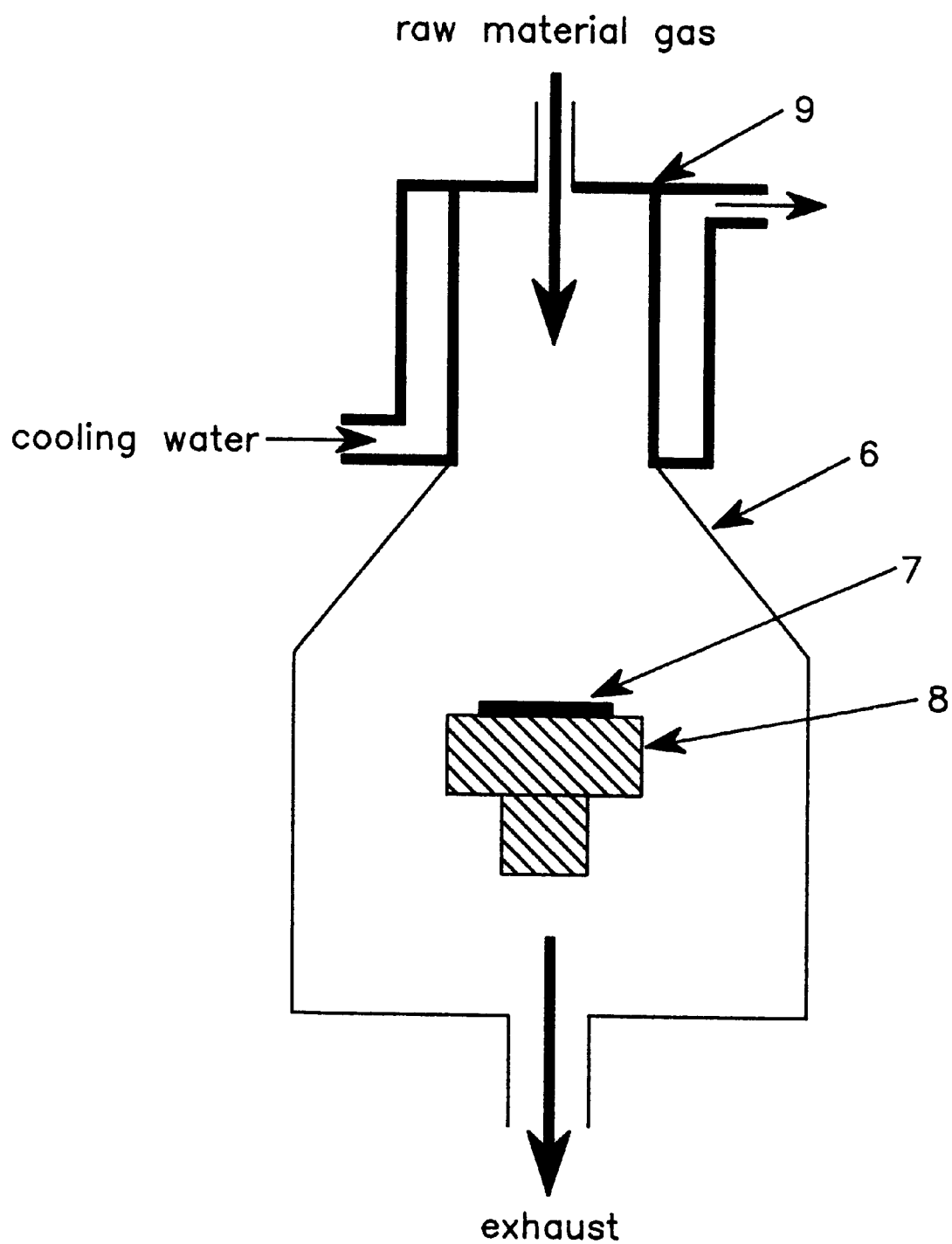
FIG. 4 is a schematic diagram illustrating one embodiment of the device for production of a compound semiconductor of the present invention.

One embodiment of the device for production of a semiconductor compound of the present invention is shown in FIG. 4. FIG. 4 illustrates a specific cooling device of the part using the metallic member, e.g. device of cooling with a circulating refrigeration medium, wherein the inside of the part is composed of a cavity.

As the refrigeration medium, there can be used a liquid such as water, ethylene glycol, silicone oil, etc.; and a vapor such as nitrogen, air, argon, etc.

It is also possible to increase the cooling efficiency by processing the part into a structure capable of easily conducting heat dissipation.

As the other cooling method, a heat pump or a Peltier device may be used. It is also possible to use as a device using these methods in combination. Moreover, in a case where raw material gas is supplied through more than one gas inlets, parts to be cooled can be selected properly by taking into account the gas or the combination of gases supplied through each inlet.

Examples of the semiconductor capable of producing a high-purity crystal by using the device of the present invention include Group III-V semiconductor compounds and Group II-VI semiconductor compound. The Group III-V semiconductor compounds refer to a material wherein a Group III element such as B, Al, Ga, In, etc. is combined with a Group V element such as N, P, As, Sb, etc. in a ratio of 1:1, or a mixed crystal thereof.

The Group II-VI compound semiconductor refers to a material wherein a Group II element such as Hg, Mg, Cd, Ca, Zn, etc. is combined with a Group VI element such as O, S, Se, Te, etc. in a ratio of 1:1, or a mixed crystal thereof.

With respect to those containing N as a constituent element of the semiconductor, since the crystal growth is generally conducted at high temperature, i.e. not less than 600° C., the device of the present invention can preferably be used. Particularly, in a light-emitting device among devices using the compound semiconductor, it is necessary for a light-emitting layer to have high purity in order to realize high light-emitting efficiency. Therefore, the device of the present invention can preferably be used.

Specific examples of the Group III-V semiconductor compound include those represented by the general formula $In_xGa_yAl_zN$ (provided that x+y+z=1, $0 \leq x \leq 1$, $0 \leq y \leq 1$, and $0 \leq z \leq 1$), which has a structure that a layer having a film thickness of not less than 5 angstroms and not more than 300 angstroms is sandwiched between two layers having a band gap larger than that of the layer.

Particularly, those having a so-called quantum well structure wherein a light-emitting layer having a thickness of 5 to 300 angstroms is sandwiched between layers having a band gap larger than that of the light-emitting layer (hereinafter referred to as a "barrier layer", sometimes), as a light-emitting device using the compound semiconductor, are important because the light-emitting efficiency of the light-emitting device using the quantum well structure is largely influenced by the purity of the quantum well structure.

As the evaluation of the quantum well structure, evaluation due to a so-called photoluminescence (hereinafter referred to as "PL", sometimes) wherein strong excitation light is irradiated and a luminescence spectrum from the irradiated part is evaluated is simple and important. Particularly, when using excitation light having an energy larger than that of a band gap of the barrier layer, a light-emitting process where electric charges generated in the barrier layer are trapped by a quantum well layer and radiatively recombine becomes a main light-emitting mechanism. Therefore, the PL spectrum sensitively reflect the crystallinity and purity of the quantum well layer. Specifically, when impurities, defects, etc., which can be non-radiative recombination centers, are present in the quantum well layer, the intensity of the PL spectrum is lowered. The structure of the spectrum becomes broad, sometimes.

When the Group III-V compound semiconductor is produced by the MOVPE method, the following precursors can be used.

That is, examples of the Group III precursors include trialkylgallium represented by the general formula $R_1R_2R_3Ga$ (wherein $R_1$, $R_2$ and $R_3$ respectively represent a lower alkyl group), such as trimethylgallium [$(CH_3)_3Ga$, hereinafter referred to as "TMG", sometimes)], triethylgallium [$(C_2H_5)_3Ga$, hereinafter referred to as "TEG", sometimes)] and the like; trialkylaluminum represented by the general formula $R_1R_2R_3Al$ (wherein $R_1$, $R_2$ and $R_3$ are as defined above), such as trimethylaluminum [$(CH_3)_3Al$], triethylaluminum [$(C_2H_5)_3Al$, hereinafter referred to as "TEA", sometimes)], triisobutylaluminum [$(i-C_4H_9)_3Al$] and the like; trialkylindium represented by the general formula $R_1R_2R_3In$ (wherein $R_1$, $R_2$ and $R_3$ are as defined above), such as trimethylindium [$(CH_3)_3In$, hereinafter referred to as "TMI", sometimes)], triethylindium [$(C_2H_5)_3In$] and the like. These are used alone or in combination thereof.

Examples of the group V precursors include ammonia, hydrazine, methylhydrazine, 1,1-dimethylhydrazine, 1,2-dimethylhydrazine, t-butylamine, ethylenediamine and the like. These are used alone or in combination thereof.

Among these precursors, ammonia and hydrazine are preferred because they contain no carbon atom in the molecule and cause little contamination of carbon into the semiconductor.

PREFERRED EMBODIMENTS OF THE INVENTION

The following Examples further illustrate the present invention in detail but are not to be construed to limit the scope thereof.

Reference Example 1

Figure 2:
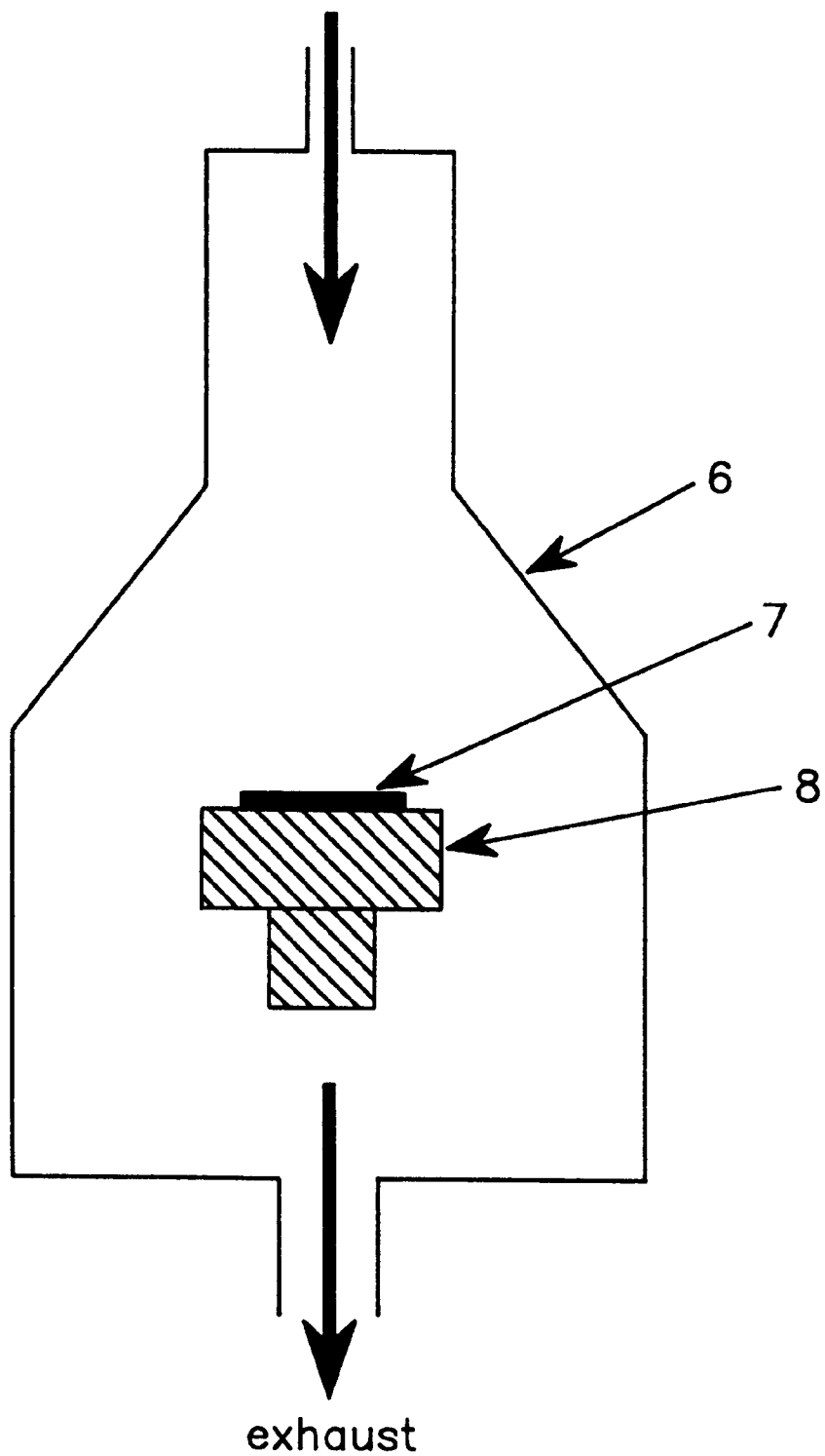
FIG. 2 is a diagram illustrating a schematic structure of the reaction furnace used in Reference Example 1.

A compound semiconductor shown in FIG. 1 was produced by using a reaction vessel having a structure shown in FIG. 2 according to MOVPE method. A quartz member was used for the part brought into contact with a raw material gas at an upstream side than the substrate of a growing device shown in FIG. 2.

As a substrate 1, those obtained by mirror-polishing the sapphire c surface were used. GaN was grown at 600° C. in a hydrogen carrier by using TMG and ammonia to form a film having a thickness of 500 angstroms as a buffer layer 2, and then a GaN layer having a thickness of 3 μm was formed at 1100° C. by using TMG and ammonia.

After cooling to 785° C., the carrier gas is changed to nitrogen from hydrogen and an $In_{0.2}Ga_{0.8}N$ layer 4 and a $Ga_{0.8}Al_{0.2}N$ layer 5 were grown by using TEG, TMI, TEA and ammonia for 70 seconds and 10 minutes, respectively. With respect to these two layers, each growing rate of films grown in thicker film thickness was 33 angstroms/minute and 30 angstroms/minute, respectively, so that each film thickness can be calculated, i.e. about 40 angstrom and 300 angstrom. The mixed crystal ratio of the Group III element is an approximate value assumed from the amount of the PL spectrum and raw material supplied.

Light of 325 nm from a He—Cd laser was focused to about 50 μm, using a lens, and irradiated to the sample thus obtained, and then PL from the part to which laser light was irradiated was observed.

Figure 3:
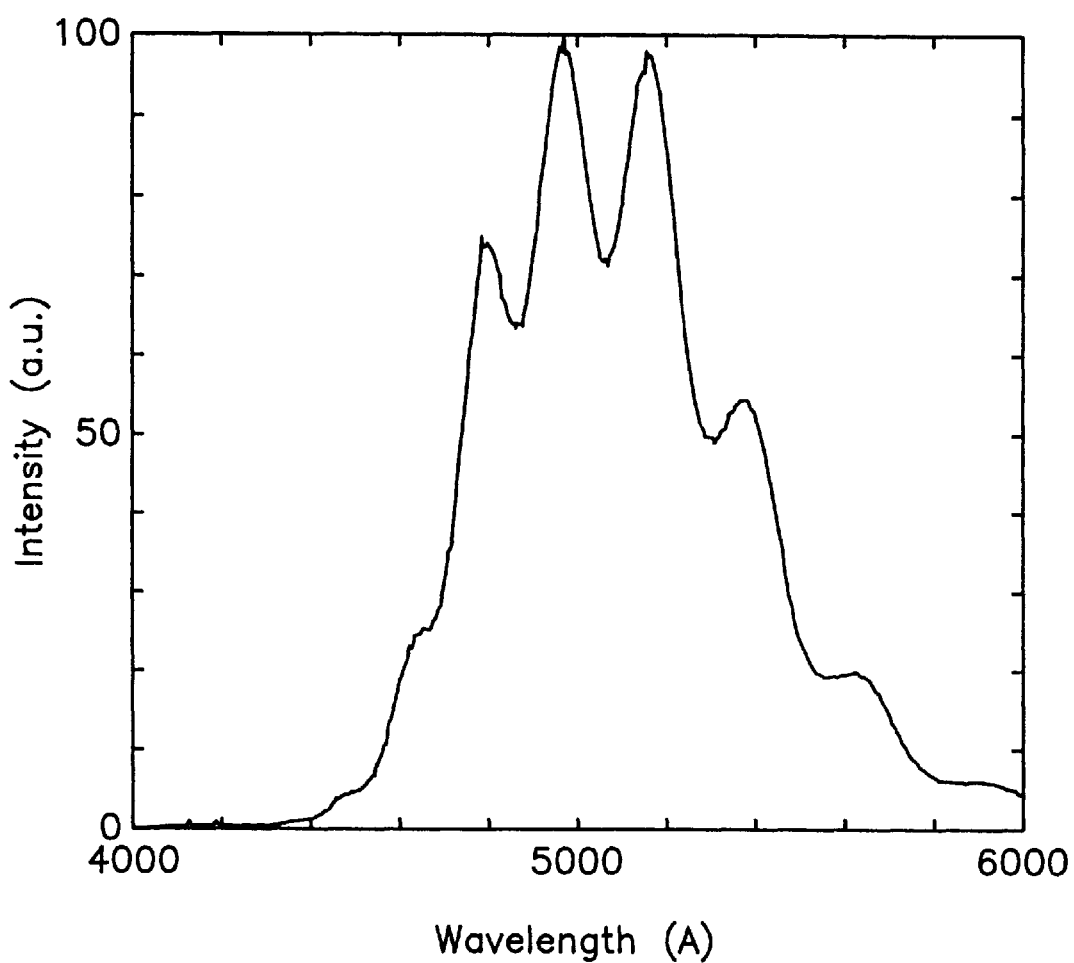
FIG. 3 is a PL spectrum of the sample obtained in Reference Example 1.

The resulting PL spectrum is shown in FIG. 3. Clear luminescence having a peak at a wavelength of about 4800 angstroms, as the luminescence from the band edge of the $In_{0.2}Ga_{0.8}N$ layer 4, was observed. The peak intensity was 2.6 mV.

EXAMPLE 1

Using a growing device using a metallic member at a part brought into contact with a raw material gas shown in FIG. 4, a Group III-V compound semiconductor was produced according to the same manner as that described in Reference Example 1. As a metal of the metallic member, SUS316 was used.

The growth of the Group III-V compound semiconductor was conducted while cooling water is allowed to flow through a cavity in the inside of a metallic part 9. At the time of growing an $In_{0.2}Ga_{0.8}N$ layer, the temperature of the inside wall part of the metallic member 9 was not higher than 90° C.

Figure 5:
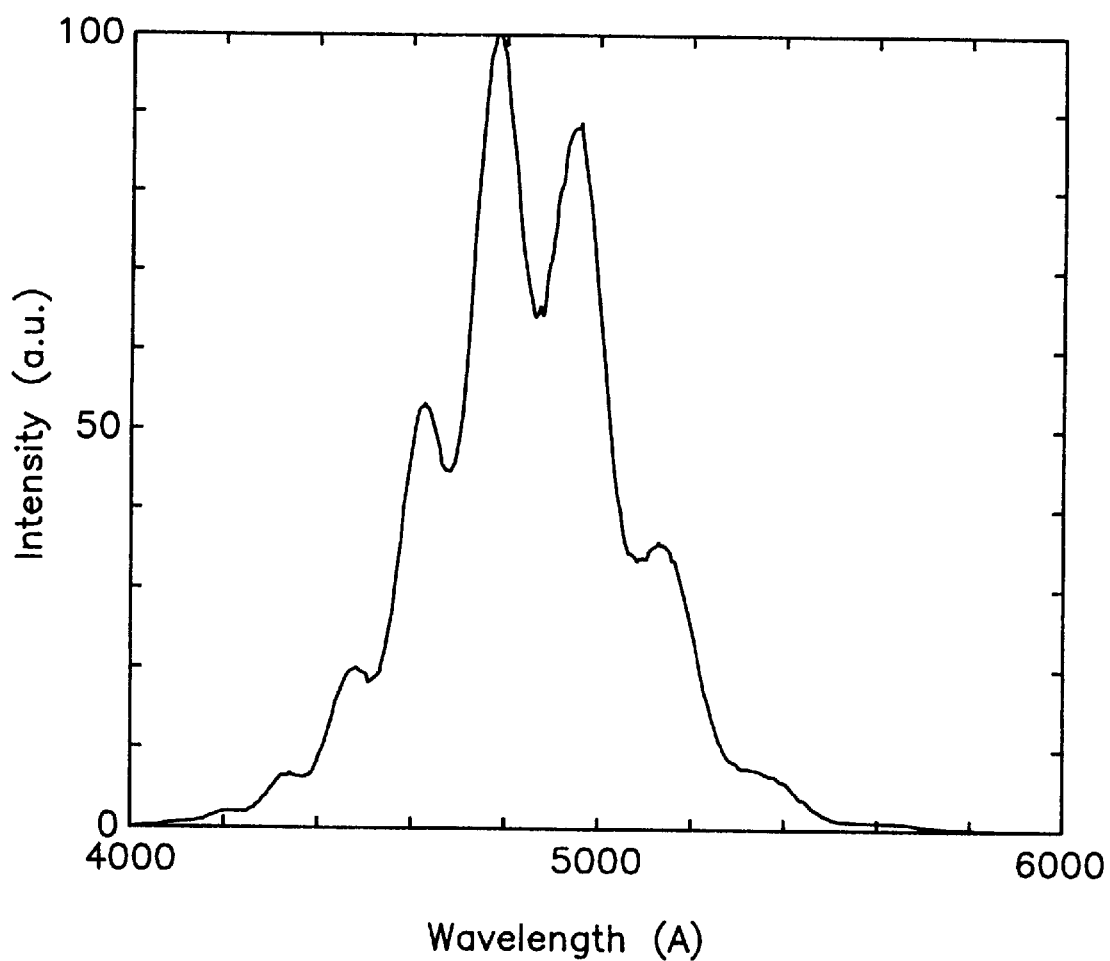
FIG. 5 is a PL spectrum of the sample obtained in Example 1 of the present invention.

PL of the sample thus obtained was observed. The PL spectrum is shown in FIG. 5. Luminescence was observed at almost the same wavelength as Reference Example 1. The peak intensity was 2.8 mV.

Comparative Example 1

According to the same manner as that described in Example 1 except that cooling water was not allowed to flow through the metallic part 9, a sample was produced. PL of the sample thus obtained was observed.

Figure 6:
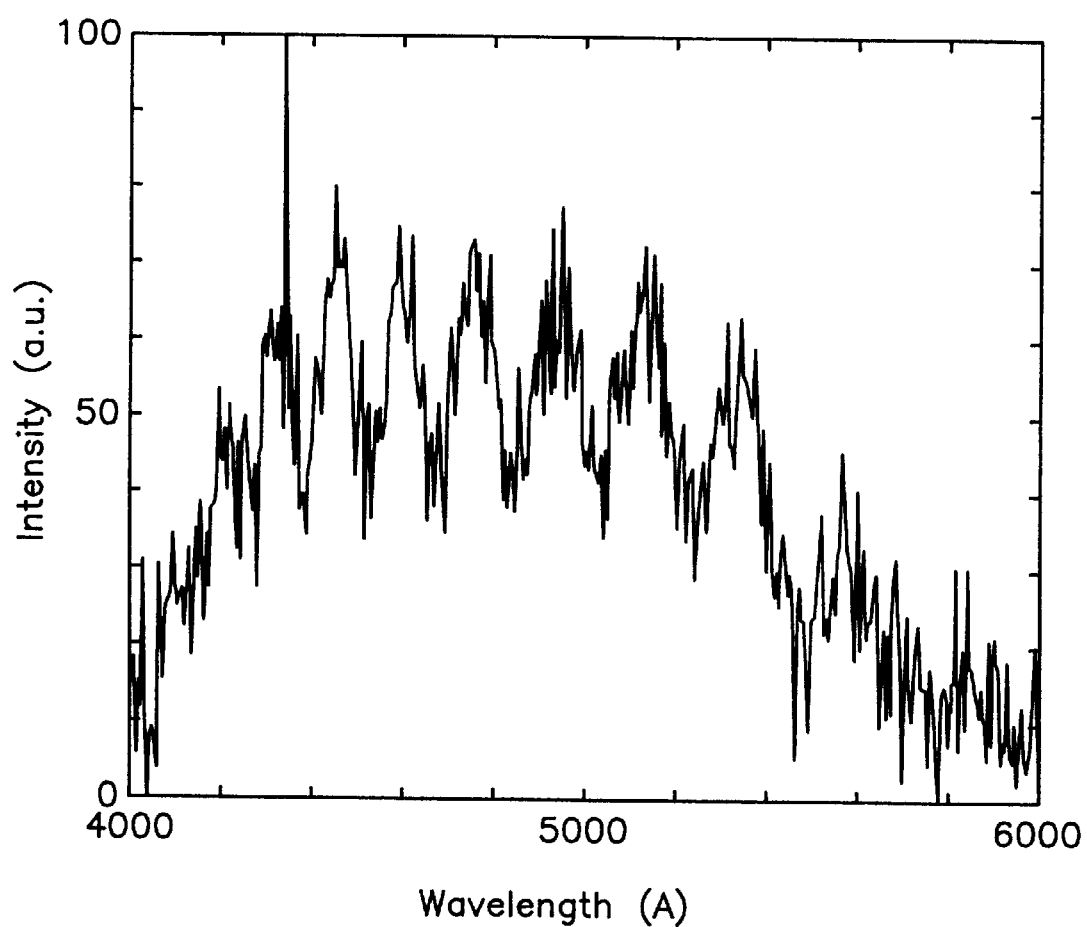
FIG. 6 is a PL spectrum of the sample obtained in Comparative Example 1 of the present invention.

The PL spectrum is shown in FIG. 6. Luminescence was observed at almost the same wavelength as Reference Example 1. Luminescence was broad and the intensity was also reduced. The peak intensity was about 20 μV. At the time of growing an $In_{0.2}Ga_{0.8}N$ layer, the temperature of the inside wall part of the metallic member 9 was 340° C.

It is considered that the purity of the light-emitting layer became high because the amount of impurities released from the alloy part is inhibited by cooling the metallic part in Example 1.

EXAMPLE 2

According to the same manner as that described in Example 1 except that the inside wall temperature of the metallic part 9 described in Example 1 was cooled to not higher than 200° C. by adjusting the flow amount of cooling water, a sample was produced.

PL of the sample thus obtained was observed. Luminescence was observed at almost the same wavelength as that of the PL spectrum with respect to the sample of Reference Example 1. The luminescence intensity was almost the same.

By using the device for production of a compound semiconductor of the present invention, a high-quality Group III-V compound semiconductor can be produced and the productivity and raw material efficiency are also improved. Therefore, the present invention is extremely useful and the industrial value thereof is great.

What is claimed is:

1. A process for production of a semiconductor compound by means of a metal organic vapor phase epitaxy method, comprising:

contacting a cooled metallic member at a position upstream of a substrate for growing the semiconductor compound with a flow of a raw material gas, wherein the semiconductor compound is a Group III-V semiconductor represented by the formula:

$In_xGa_yAl_zN$ wherein $x+y+z=1$, $0 \leq x \leq 1$, $0 \leq y \leq 1$, and $0 < z \leq 1$; and contains an InGaN layer and an AlGaN layer thereon, wherein the InGaN layer has a film thickness of not less than 5 angstroms and not more than 300 angstroms and is sandwiched between two layers having a band gap larger than that of the InGaN layer, said metallic member being cooled to a temperature of not higher than 300° C.

2. The process for production of a semiconductor compound according to claim 1, wherein the metallic member is a heat-resistant alloy.

3. The process for production of a semiconductor compound according to claim 2, wherein the heat-resistant alloy is a heat-resistant steel, a stainless steel, a nickel-based alloy or a titanium alloy.

4. The process for production of a semiconductor compound according to claim 1, wherein the metallic portion is in contact with a reaction vessel made from quartz.

5. The process for production of a semiconductor compound according to claim 1, wherein the metallic member is cooled to a temperature of not higher than 200° C.

* * * * *